United States Patent
Kau et al.

(10) Patent No.: US 8,649,212 B2
(45) Date of Patent: Feb. 11, 2014

(54) METHOD, APPARATUS AND SYSTEM TO DETERMINE ACCESS INFORMATION FOR A PHASE CHANGE MEMORY

(75) Inventors: Derchang Kau, Cupertino, CA (US); Albert Fazio, Saratoga, CA (US)

(73) Assignee: Intel Corporation, Santa Clara, CA (US)

(*) Notice: Subject to any disclaimer, the term of this patent is extended or adjusted under 35 U.S.C. 154(b) by 528 days.

(21) Appl. No.: 12/890,581

(22) Filed: Sep. 24, 2010

(65) Prior Publication Data
US 2012/0075924 A1    Mar. 29, 2012

(51) Int. Cl.
*G11C 11/00* (2006.01)

(52) U.S. Cl.
USPC .............................. 365/163; 365/158; 365/171

(58) Field of Classification Search
USPC .......................................... 365/163, 158, 171
See application file for complete search history.

(56) References Cited

U.S. PATENT DOCUMENTS

| | | | |
|---|---|---|---|
| 6,707,712 B2 * | 3/2004 | Lowery ........................ | 365/175 |
| 6,791,102 B2 | 9/2004 | Johnson et al. | |
| 6,795,338 B2 | 9/2004 | Parkinson et al. | |
| 7,135,696 B2 | 11/2006 | Karpov et al. | |
| 7,308,067 B2 | 12/2007 | Lowrey et al. | |
| 7,391,642 B2 | 6/2008 | Gordon et al. | |
| 7,440,308 B2 * | 10/2008 | Jeong et al. .................. | 365/148 |
| 7,791,934 B2 * | 9/2010 | Kang et al. ................... | 365/163 |
| 7,864,566 B2 * | 1/2011 | Breitwisch et al. .......... | 365/163 |
| 8,036,014 B2 * | 10/2011 | Lee et al. ..................... | 365/148 |
| 2006/0227592 A1 | 10/2006 | Parkinson et al. | |

FOREIGN PATENT DOCUMENTS

| | | |
|---|---|---|
| KR | 100781550 | 3/2007 |
| KR | 20090117464 | 12/2009 |

OTHER PUBLICATIONS

"International Search Report and Written Opinion of the International Searching Authority for Application No. PCT/US2011/053171", (Feb. 28, 2012).

* cited by examiner

*Primary Examiner* — Pho M Luu
(74) *Attorney, Agent, or Firm* — Blakely, Sokoloff, Taylor & Zafman LLP

(57) ABSTRACT

Techniques for determining access information describing an accessing of a phase change memory (PCM) device. In an embodiment, an initial read time for a PCM cell is determined based on a final read time for the PCM cell, set threshold voltage information and a reset threshold voltage drift, wherein the final read time and the initial read time define a time window for reading the PCM cell. In another embodiment, a time window extension is determined based on a reset threshold voltage drift.

20 Claims, 6 Drawing Sheets

METHOD, APPARATUS AND SYSTEM TO DETERMINE ACCESS INFORMATION FOR A PHASE CHANGE MEMORY

BACKGROUND

1. Technical Field

The present invention relates generally to accessing phase change memory device. More particularly, certain embodiments relate to determining access information which describes an access of a phase change memory cell.

2. Background Art

Phase change memory (PCM) uses a class of materials that switch between two phases having distinct electrical characteristics, associated with two different crystallographic structures. More particularly, a PCM cell may variously change between an amorphous, disorderly phase and a crystalline (or polycrystalline) orderly phase. The two phases are hence associated with resistivities of different values.

Currently, the alloys of elements of group VI of the periodic table, such as Te or Se, referred to as chalcogenides or chalcogenic materials, can be used advantageously in phase change memory cells. One promising chalcogenide is formed from an alloy of Ge, Sb and Te—i.e. $Ge_2Sb_2Te_5$. The resistivity of phase change materials may vary by several orders of magnitude upon switching between the fully set (crystalline) state to the fully reset (amorphous) state.

Improvements in data storage and access rates for computer components and/or platforms impose requirements which are increasingly burdensome on overall system design, and PCM is not exempt from these impositions. Previous techniques for implementing PCM—including techniques determining how and/or when PCM cells may be accessed—are increasingly in conflict with new, stricter design specifications which system designers and industry standards are introducing.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
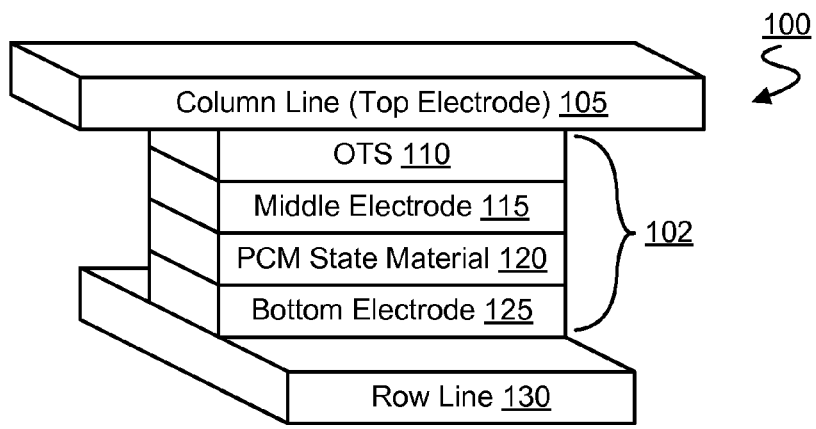
FIG. 1A is a block diagram showing a phase change memory (PCM) cell for which access information is determined according to an embodiment.

FIG. 1 illustrates select elements of a system 100 including a phase change memory (PCM) cell 102 for which access information is determined according to an embodiment. System 100 may include a register, queue, cache, array or other data storage structure—e.g. having one or more additional PCM cells (not shown).

In an embodiment, system 100 includes a column line 105 and a row line 130 coupled to opposing sides of PCM cell 102 to selectively enable writing data to and/or reading data from PC cell 102. Column line 105 and/or row line 130 may each be referred to as an address line, where a given line may be used to address PCM cell 102 during programming or reading. Column line 105 and/or row line 130 may also be referred to as a bit line and/or a word line, depending on whether or how column line 105 and/or row line 130 is used in accessing a specific one PCM cell or multiple different PCM cells.

PCM cell 102 may include—e.g. in successive layers between column line 105 and row line 130—an ovonic threshold switch (OTS) 110 to selectively isolate the PCM cell 102 from conducting current, a middle electrode 115, a PCM state material 120 to maintain a state representing a particular stored data value and OTS 110, and a bottom electrode 125. It is understood that PCM cell 102 may include any of a variety of additional and/or alternative structures according to various embodiments, wherein the structures individually or in combination provide PCM cell 102 with one or more threshold voltage drift characteristics as described herein.

In an embodiment, PCM state material 120 comprises a phase change material. A phase change material may be a material having electrical properties (e.g. resistance, capacitance, etc.) that may be changed through the application of energy such as, for example, heat, light, voltage potential, or electrical current. Examples of a phase change material may include a chalcogenide material or an ovonic material.

An ovonic material may be a material that undergoes electronic or structural changes and acts as a semiconductor when subjected to application of a voltage potential, an electrical current, light, heat, etc. An ovonic material may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium. In one embodiment, PCM state material 120 may be a chalcogenide element composition of the class of tellurium-germanium-antimony ($Te_xGe_ySb_z$) material or a GeSbTe alloy, although various embodiments are not limited to just these.

PCM state material 120 may be programmed into one of at least two memory states by applying an electrical signal to PCM state material 120 to alter the phase of PCM state material 120 between a substantially crystalline state and a substantially amorphous state, wherein a resistance of PCM state material 120 in the substantially amorphous state is greater than the resistance of PCM state material 120 in the substantially crystalline state. Programming of PCM state material 120 to alter the state or phase of the material may be accomplished by applying voltage potentials to middle electrode 115 and bottom electrode 125, thereby generating a voltage potential across PCM state material 120. An electrical current may flow through a portion of PCM state material 120 in response to the applied voltage potentials, and may result in heating of PCM state material 120.

This heating and subsequent cooling may alter the memory state or phase of PCM state material 120. Altering the phase or state of PCM state material 120 may alter an electrical characteristic of PCM state material 120. For example, the resistance of the material may be altered by altering the phase of the PCM state material 120. PCM state material 120 may also be referred to as a programmable resistive material or simply a programmable material.

In one embodiment, a voltage potential difference of about three volts may be applied across a portion of PCM state material 120 by applying about three volts to electrode 115 and about zero volts to electrode 125. A current may flow through PCM state material 120 in response to the applied voltage potentials, and may result in heating of PCM state material 120. This heating and subsequent cooling may alter the memory state or phase of PCM state material 120.

In a "set" state, PCM state material 120 may be in a crystalline or semi-crystalline state, and in a "reset" state, at least a portion of PCM state material 120 may be in an amorphous or semi-amorphous state. The resistance of PCM state material 120 in the amorphous or semi-amorphous state may be greater than the resistance of PCM state material 120 in the crystalline or semi-crystalline state. It is to be appreciated that the association of reset and set with amorphous and crystalline states, respectively, is a convention and that at least an opposite convention may be adopted.

Using electrical current, PCM state material 120 may be heated to a relatively higher temperature to amorphisize PCM state material 120 and "reset" PCM state material 120 (e.g., program PCM state material 120 to a logic "0" value). Heating the volume of PCM state material 120 to a relatively lower crystallization temperature may crystallize PCM state material 120 and "set" PCM state material 120 (e.g., program PCM state material 120 to a logic "1" value). Various resistances of PCM state material 120 may be achieved to store information by varying the amount of current flow and duration through the volume of PCM state material 120.

The information stored in PCM state material 120 may be read by measuring the resistance of PCM state material 120. As an example, a read—e.g. "demarcation"—voltage may be provided to PCM state material 120 using electrodes 115 and 125, and a resulting read voltage across PCM state material 120 may be compared against a reference voltage using, for example, a sense amplifier (not shown). The read voltage may be proportional to the resistance exhibited by the memory cell. Thus, a higher voltage may indicate that PCM state material 120 is in a relatively higher resistance state, e.g., a "reset" state; and a lower voltage may indicate that the PCM state material 120 is in a relatively lower resistance state, e.g., a "set" state.

OTS 110 may be used to access PCM state material 120 during programming or reading of PCM state material 120. OTS 110 may include ovonic material to operate as a switch that is either "off" or "on" depending on an amount of voltage potential applied across the ovonic material. The off state may be a substantially electrically nonconductive state and the on state may be a substantially conductive state. For example, OTS 110 may have a threshold voltage and if a voltage potential less than the threshold voltage of OTS 110 is applied across OTS 110, then OTS 110 may remain "off" or in a relatively high resistive state so that little or no electrical current passes through the memory cell. Alternatively, if a voltage potential greater than the threshold voltage of OTS 110 is applied across OTS 110, then OTS 110 may "turn on," i.e., operate in a relatively low resistive state so that electrical current passes through the memory cell. In other words, OTS 110 may be in a substantially electrically nonconductive state if less than a predetermined voltage potential, e.g., the threshold voltage, is applied across OTS 110. OTS 110 may be in a substantially conductive state if greater than the predetermined voltage potential is applied across OTS 110. OTS 110 may also be referred to as an access device or an isolation device.

In one embodiment, OTS 110 may comprise a switching material such as, for example, a chalcogenide or an ovonic material, and may be referred to as an ovonic threshold switch, or simply an ovonic switch. The switching material of OTS 110 may be a material in a substantially amorphous state positioned between two electrodes that may be repeatedly and reversibly switched between a higher resistance "off" state (e.g., greater than about ten mega-ohms) and a relatively lower resistance "on" state (e.g., about zero ohms) by application of a predetermined electrical current or voltage potential. In this embodiment, OTS 110 may be a two terminal device that may have a current-voltage (I-V) characteristic similar to a phase change memory element that is in the amorphous state. However, unlike a phase change memory element, the switching material of OTS 110 may not change phase. That is, the switching material of OTS 110 may not be a programmable material, and as a result, OTS 110 may not be a memory device capable of storing information. For example, the switching material of OTS 110 may remain permanently amorphous and the I-V characteristic may remain the same throughout the operating life.

Figure 1B:
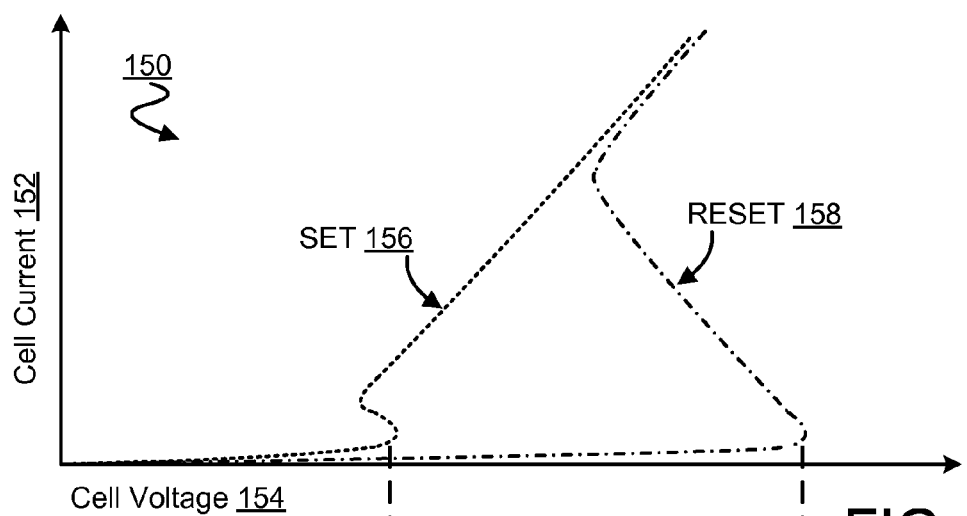
FIG. 1B is a graph showing a conceptual representation of PCM cell current as a function of a PCM cell voltage.

FIG. 1B is a graph 150 showing a conceptual representation of a cell current 152 for a given PCM cell as a function of a cell voltage 154 which his applied to that PCM cell. More particularly, graph 150 includes a curve 156 for the cell current which is carried by a PCM cell when an PCM material of the cell is in a crystalline or semi-crystalline state (referred to herein as a "set" state) for a range of voltages applied across the PCM state material of that memory cell. Curve 156 may, for example, represent the current conducting characteristics of PCM cell 102 when PCM state material 120 is in a set state. Graph 150 also includes a curve 158 for the cell current which is carried by a PCM cell when an PCM material of the cell is in an amorphous or semi-amorphous state (referred to herein as a "reset" state) for a range of voltages applied across the PCM state material of that memory cell. Curve 158 may, for example, represent the current conducting characteristics of PCM cell 102 when PCM state material 120 is in a reset state.

As shown in graph 150, a set threshold voltage $V_{TH\_SET}$ 170 in the cell voltage range 154 corresponds to an inflection point in curve 156, where the memory cell represented by curve 156—a cell which is in a set state—begins to exhibit very large changes in cell current for small changes in cell voltage. For example, in a low voltage or low electric field mode, i.e., where the voltage applied across PCM cell 102 is less than a threshold voltage (e.g. $V_{TH\_SET}$ 170), PCM cell 102 may be "off" or effectively nonconducting, and exhibit a relatively high resistance, e.g., greater than about 10 megaOhms. PCM cell 102 may remain in the off state until a sufficient voltage, e.g., $V_{TH\_SET}$ 170, is applied that may switch PCM cell 102 to a conductive, relatively low resistance "on" state. If a voltage potential of greater than about $V_{TH\_SET}$ 170 is applied across PCM cell 102, the current carried by PCM cell 102 changes greatly for small changes in the applied voltage.

Similarly, a reset threshold voltage $V_{TH\_RESET}$ 180 in the cell voltage range 154 corresponds to an inflection point in curve 158, where the memory cell represented by curve 158—a cell which is in a reset state—also begins to exhibit very large changes in cell current for small changes in cell voltage. For example, if a voltage potential of greater than about $V_{TH\_RESET}$ 180 is applied across PCM cell 102, the current carried by PCM cell 102 changes greatly for small changes in applied voltage.

Figure 1C:
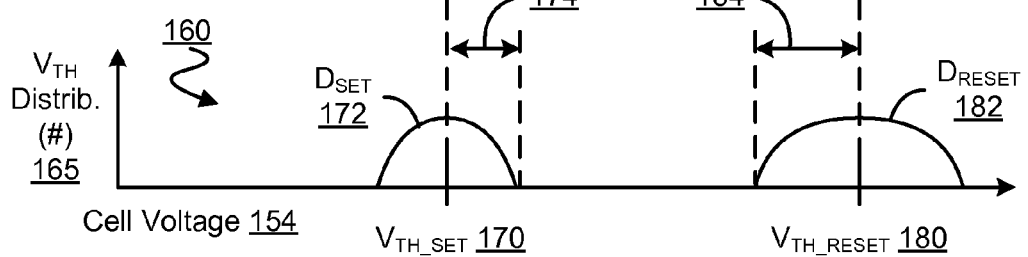
FIG. 1C is a graph showing a conceptual representation of threshold voltage distributions for a PCM cell.

FIG. 1C is a graph 160 showing a conceptual representation of voltage threshold distribution 165 for multiple PCM cells along a range of cell voltage 154. More particularly, graph 160 illustrates how the respective set threshold voltages and reset threshold voltages of multiple PCM cells are distributed along the cell voltage range 154.

A first distribution $D_{SET}$ 172 of graph 160 represents an illustrative group of set threshold voltages for multiple PCM cells when their PCM state material is each in a respective set state. $D_{SET}$ 172 may be characterized by one or more parameters including, but not limited to, any of a variety of combinations of one or more statistical measures (e.g. distribution mean, median, standard deviation, etc.). Similarly, a second distribution $D_{RESET}$ 182 of graph 160 represents an illustrative group of reset threshold voltages for the multiple PCM cells when the cells are each in a reset state. $D_{RESET}$ 182 may also be characterized by one or more parameters, e.g. statistical measures.

By way of illustration and not limitation, $D_{SET}$ 172 is shown as centered on $V_{TH\_SET}$ 170 and having a spread 174 within which all set threshold voltages are located. By contrast, $D_{RESET}$ 182 is shown as centered on $V_{TH\_RESET}$ 180 with a spread 184. It is understood that the location and/or shape of either or both of $D_{SET}$ 172 and $D_{RESET}$ 182 along the cell voltage range 154 may vary, according to different embodiments.

Figure 2A:
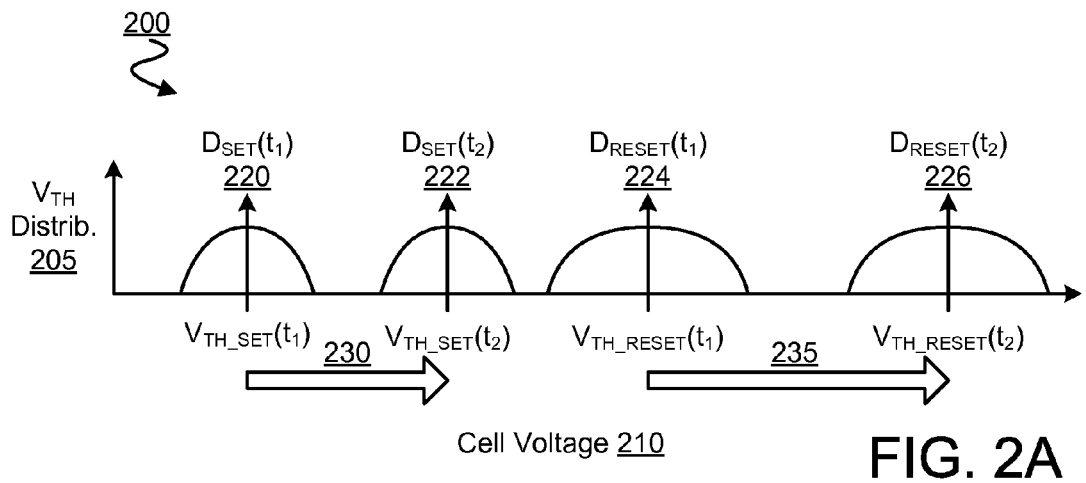
FIG. 2A is a graph showing a conceptual representation of drifting threshold voltage distributions for a PCM cell.

FIG. 2A is a graph 200 showing a conceptual representation of how voltage threshold distribution 205 for multiple PCM cells increases shifts over time along a cell voltage range 210. Graph 200 may include, for example, some or all of the features of graph 160. A distribution $D_{SET}(t_1)$ 220 of graph 200 represents an illustrative group of set threshold voltages for each of multiple PCM cells, where each set threshold voltage is for $t_1$ units of time after a SET state was asserted for the corresponding PCM cell. Another distribution $D_{RESET}(t_1)$ 224 of graph 200 represents an illustrative group of reset threshold voltages for each of the multiple PCM cells, where each reset threshold voltage is for the $t_1$ units of time after a RESET state was asserted for the corresponding PCM cell.

Due to structural relaxation in the ovonic or other PCM state material of PCM systems, both SET and RESET threshold voltages increase over time. Such increasing is referred to herein as threshold voltage drift. In an embodiment, for each PCM cell represented by a respective set threshold voltage in distribution $D_{SET}(t_1)$ 220, the OTS and/or PCM state material of that PCM cell will, either individually or in combination, exhibit a level of structural stress in the PCM cell upon the asserting of a SET state in that memory cell. The level of structural stress will decrease over time after the asserting of a SET state, which will cause the set threshold voltage for that PCM cell to drift up in voltage level. When considered as a group, the multiple PCM cells may, for example, exhibit an increase 230 which moves distribution $D_{SET}(t_1)$ 220 at $t_1$ units of time after the SET state being asserted to distribution $D_{SET}(t_2)$ 222 at $t_2$ units of time after the SET state being asserted.

In a like manner, for each PCM cell represented by a respective reset threshold voltage in distribution $D_{RESET}(t_1)$ 224, the OTS and/or PCM state material of that PCM cell will, either individually or in combination, exhibit a level of structural stress in the PCM cell upon the asserting of a RESET state in that memory cell. The level of structural stress will decrease over time after the asserting of the RESET state, which will cause the reset threshold voltage for that PCM cell to drift up in voltage level. When considered as a group, the multiple PCM cells may, for example, exhibit an similar increase 235 which moves distribution $D_{RESET}(t_1)$ 224 at $t_1$ units of time after the RESET state being asserted to distribution $D_{RESET}(t_2)$ 226 at $t_2$ units of time after the RESET state being asserted.

Figure 2B:
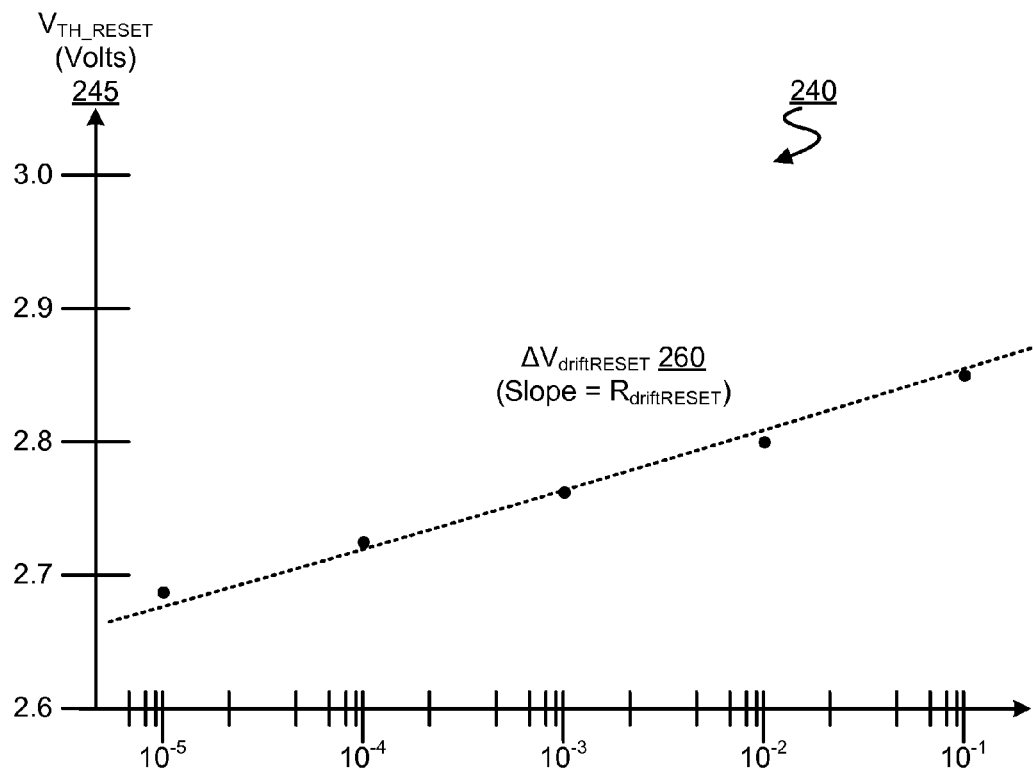
FIG. 2B is a graph showing a conceptual representation of a logarithmic relationship of threshold voltage to time for a PCM cell.

FIG. 2B is a graph 240 showing a conceptual representation of a threshold voltage drift $\Delta V_{driftRESET}$ 260 of a reset threshold voltage of a PCM cell. $\Delta V_{driftRESET}$ 260 includes a change along a reset threshold voltage domain $V_{TH\_RESET}$ 245 over a time range 250. A similar threshold voltage drift $\Delta V_{driftSET}$ (not shown) may be plotted along a logarithmic time scale for a change along a set threshold voltage domain $V_{TH\_SET}$. In an embodiment a set threshold voltage drift $\Delta V_{driftSET}$ may have a different slope $R_{drift.SET}$ than the slope $R_{drift.RESET}$ of $\Delta V_{driftRESET}$, although various embodiments are not limited in this regard. It is understood that $\Delta V_{driftRESET}$ 260 is merely illustrative, and that $\Delta V_{driftRESET}$ 260 and/or a $\Delta V_{driftSET}$ may variously exhibit any of a variety of changes in threshold voltage values which are linear with a logarithm of any a variety of time values.

Various embodiments determine access information for a PCM device based on the fact that a change in a threshold voltage—e.g. a reset threshold voltage drift such as $\Delta V_{driftRESET}$ 260 or a set threshold voltage drift ($\Delta V_{driftSET}$, not shown)—changes linearly with a logarithm of time 250. More particularly, the determining of access information may, according to an embodiment, include calculating or otherwise obtaining information describing slope $R_{drift.RESET}$.

In an embodiment, a slope $R_{drift}$ for a threshold voltage drift $\Delta V_{drift}$ may be determined by design testing of a PCM device's performance. By way of illustration and not limitation, a threshold voltage $V_{TH}$ for a PCM cell (or cells) may be evaluated repeatedly—e.g. at a time toiler a particular state (e.g. a SET state or a RESET state) has been asserted in the PCM cell, and again at a time $t_2$ after the asserting. The slope $R_{drift}$ may be calculated, for example, as:

$$R_{drift}=[V_{TH}(t_2)-V_{TH}(t_1)]/[\log(t_2)-\log(t_1)]=[V_{TH}(t_2)-V_{TH}(t_1)]/[\log(t_2/t_1)]. \qquad (1)$$

$R_{drift}$ will be a $R_{drift.SET}$ value if evaluations are for a PCM cell which has a PCM state material in a SET state, and a $R_{drift.RESET}$ value if evaluations are for a PCM cell which has a PCM state material in a RESET state.

Figure 3A:
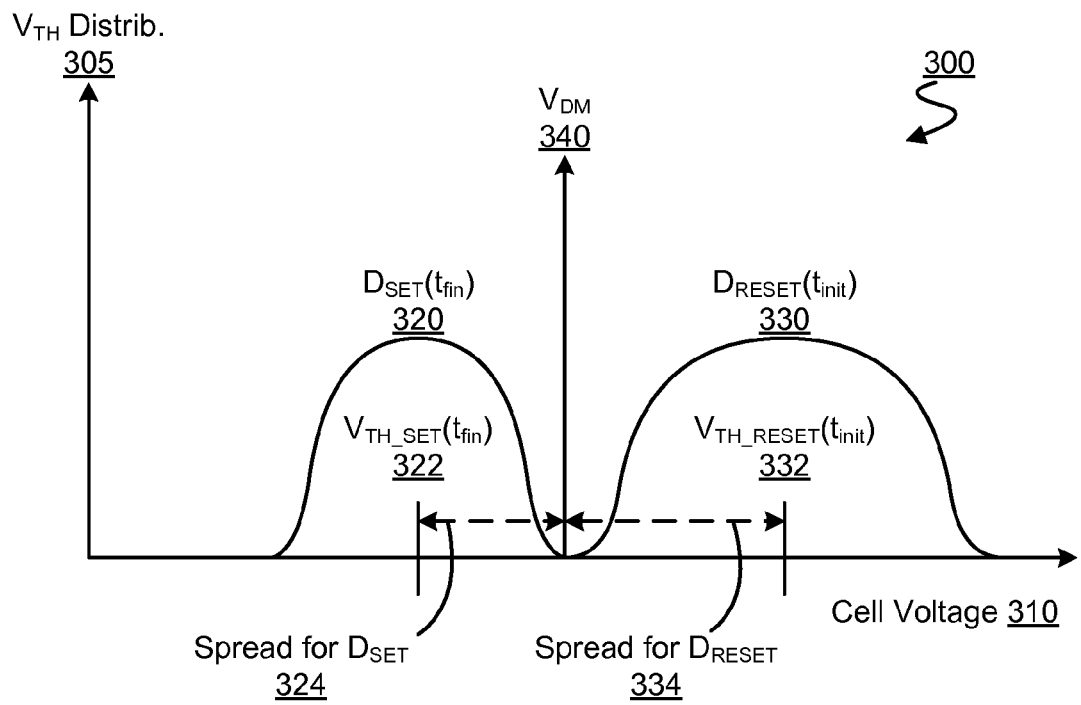
FIG. 3A is a graph showing techniques for determining, according to an embodiment, a demarcation voltage use in accessing a PCM cell.

FIG. 3A is a graph 300 illustrating the use of voltage threshold distribution 305 along a range of cell voltage 310 to identify an effective value for a demarcation voltage $V_{DM}$ 340. Features of graph 300 may include corresponding features of graph 160, for example. In an embodiment, a demarcation voltage $V_{DM}$ 340 is to be determined for use in identifying whether a given PCM cell is in a particular state—e.g. a SET state or a RESET state. To determine the state of the PCM cell in question, $V_{DM}$ 340 may be applied across the PCM cell, e.g. across a PCM state material of the PCM cell, where a resulting current carried by the PCM cell may indicate that the PCM state material is in a SET state, and where a lack of current carried by the PCM cell may indicate that the PCM state material is in a RESET state.

Various embodiments determine a $V_{DM}$ 340 to use by taking into account the effects of threshold voltage drift. Graph 300 shows a set threshold voltage distribution $D_{SET}(t_{fin})$ for some time $t_{fin}$ which is given as a performance requirement for a PCM device which includes the PCM cell. In an embodiment, $t_{fin}$ represents the required minimum period of time that data in a PCM cell must remain readable after such data has been asserted (e.g. by a SET or RESET) in the PCM cell.

From design testing of a PCM device's performance, it may be determined that threshold voltage drift after $t_{fin}$ units of time will cause set threshold voltages for that PCM device to drift to $D_{SET}(t_{fin})$ 320. The shape of $D_{SET}(t_{fin})$ 320 may also be determined from such design testing. By way of illustration and not limitation, the shape of $D_{SET}(t_{fin})$ 320 may be determined to be characterized by one or more parameters such as a mean voltage $V_{TH\_SET}(t_{fin})$ 322 and a $D_{SET}$ spread 324 surrounding $V_{TH\_SET}(t_{fin})$ 322, within which the set threshold voltages of $D_{SET}(t_{fin})$ 320 reside.

With $D_{SET}(t_{fin})$ 320 determined, some $V_{DM}$ 340 which is above $D_{SET}(t_{fin})$ 320 may be identified, according to an embodiment. By way of illustration and not limitation, $V_{DM}$ 340 may be calculated as:

$$V_{DM} \geq V_{TH\_SET}(t_{fin}) + (D_{SET}\text{spread}), \quad (2.1)$$

or $$V_{DM} = V_{TH\_SET}(t_{fin}) + (D_{SET}\text{spread}) + (\epsilon_1) \quad (2.2)$$

where $\epsilon_1$ is some nominal value to clearly distinguish that the PCM cell is in a set state. In an embodiment, $\epsilon_1$ is a voltage margin required to account for measured voltage variations which are contributed, for example, by controlling circuitry and/or memory array parasitics. Setting $V_{DM}$ 340 above $D_{SET}(t_{fin})$ 320 will assure that, for the entire $t_{fin}$ time units specified by the performance requirement, $V_{DM}$ 340 will activate any and all PCM cells which are in a SET state.

The determined $D_{SET}(t_{fin})$ 320—and/or the related $V_{DM}$ 340—may establish a lower bound for reset threshold values of the PCM device. For example, the $V_{TH\_RESET}$ of a PCM cell cannot overlap $D_{SET}(t_{fin})$ 320 during the specified $t_{fin}$ time units without the risk of being mistakenly read being in a SET state. To reduce this risk, various embodiments identify a number of time units $t_{init}$ to expire after a RESET (or other) state has been asserted for an initial time before which a PCM cell may not to be read.

The value of $t_{init}$ may be determined, for example, to assure that the $V_{TH\_RESET}$ for any and all RESET PCM cells which may at first be below $V_{DM}$ 340—e.g. which at first overlap $D_{SET}(t_{fin})$ 320—will have drifted above $V_{DM}$ 340 before its data is to be read. In an embodiment, a reset threshold voltage distribution $D_{RESET}(t_{init})$ 330 for the PCM device is centered on $V_{TH\_RESET}(t_{init})$ 332 and has a spread 334. $D_{RESET}(t_{init})$ 330 may be set above $V_{DM}$ 340 with the following:

$$V_{TH\_RESET}(t_{init}) \geq V_{DM} + (D_{RESET}\text{Spread}), \quad (3.1)$$

or $$V_{TH\_RESET}(t_{init}) = V_{DM} + (D_{RESET}\text{spread}) + (\epsilon_2) \quad (3.2)$$

where $\epsilon_2$ is some nominal value to clearly distinguish that the PCM cell is in a RESET state. In an embodiment, $\epsilon_2$ is a voltage margin required to account for measured voltage variations which are contributed, for example, by controlling circuitry and/or memory array parasitics. Setting $D_{SET}(t_{fin})$ 320 above $V_{DM}$ 340 may assure that, for more than $t_{init}$ time units after a RESET state has been asserted in a PCM cell, $V_{DM}$ 340 will not activate that PCM cell while it is in that RESET state.

Figure 3B:
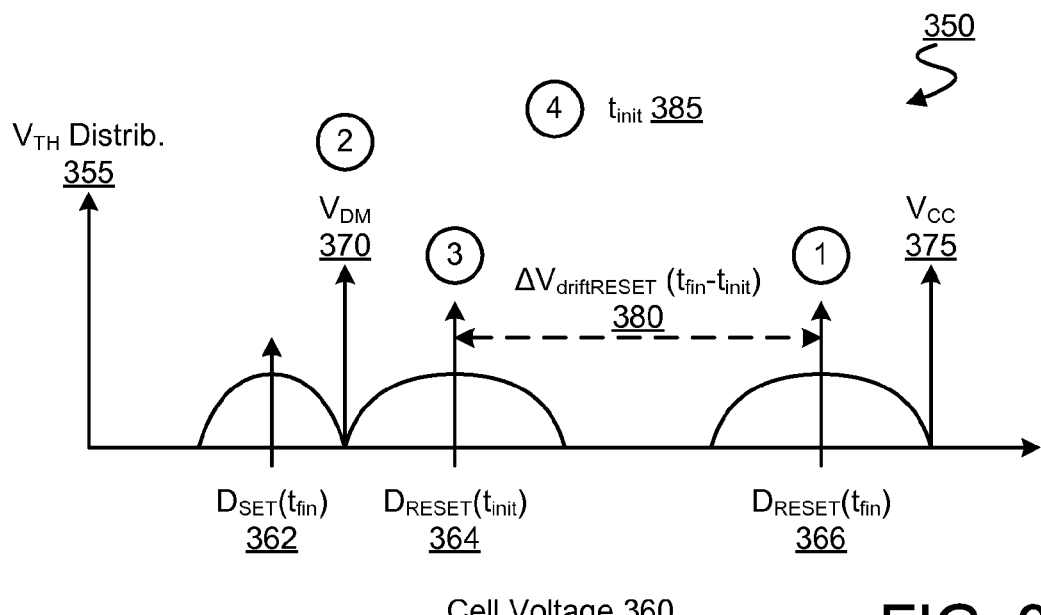
FIG. 3B is a graph showing techniques for determining, according to an embodiment, a time window for use in accessing a PCM.

FIG. 3B is a graph 350 illustrating the use of threshold voltage drift and voltage threshold distribution 355 along a cell voltage range 360 to identify, according to an embodiment, a time window $(t_{fin}-t_{init})$ during which data in a PCM cell may be read. Features of graph 350 may include corresponding features of graph 300, for example.

A final reset threshold voltage distribution $D_{RESET}(t_{fin})$ 366 may be determined for the given performance requirement $t_{fin}$. In an embodiment, $D_{RESET}(t_{fin})$ 366 is set to be below, or just at, the supply voltage $V_{CC}$ 375 which powers the PCM cell. By way of illustration and not limitation, a $D_{RESET}(t_{fin})$ may be located with the following:

$$V_{TH\_RESET}(t_{fin}) \leq V_{CC} - (D_{RESET}\text{spread}), \quad (4.1)$$

or $$V_{TH\_RESET}(t_{fin}) = V_{CC} - (D_{RESET}\text{spread}) - (\epsilon_3) \quad (4.2)$$

where $D_{RESET}(t_{fin})$ is centered on $V_{TH\_RESET}(t_{fin})$, and where $\epsilon_3$ is some nominal value to clearly distinguish that $D_{RESET}$ does not include $V_{CC}$. In an embodiment, $\epsilon_3$ is a voltage margin required to account for measured voltage variations which are contributed, for example, by controlling circuitry and/or memory array parasitics. It is understood that any of a variety of additional or alternate operating requirements of the PCM device may affect the location of $D_{RESET}(t_{fin})$ 366.

As discussed above with reference to FIG. 3A, $t_{fin}$ may be a basis for determining one or more of a set threshold voltage distribution $D_{SET}(t_{fin})$ 362, a demarcation voltage $V_{DM}$ 370 and a reset threshold voltage distribution $D_{RESET}(t_{init})$ 364 for an initial time $t_{init}$. More particularly, $D_{SET}(t_{fin})$ 362, $V_{DM}$ 370 and $D_{RESET}(t_{init})$ 364 may correspond, respectively to $D_{SET}(t_{fin})$ 320, $V_{DM}$ 340 and $D_{RESET}(t_{init})$ 330.

The determined $D_{RESET}(t_{init})$ 330 may be used to determined the actual amount of time $t_{init}$. By way of illustration and not limitation, a difference between $D_{RESET}(t_{fin})$ 366 and $D_{RESET}(t_{init})$ 364—e.g. a difference between their respective means $V_{TH\_RESET}(t_{fin})$ and $V_{TH\_RESET}(t_{init})$—may determine a total reset voltage drift $\Delta V_{drift.RESET}$ 380 which takes place during the time window $(t_{fin}-t_{init})$. From $\Delta V_{drift.RESET}$ 380, the value of $t_{init}$ 385 may be determined, for example, by:

$$t_{init} \geq t_{fin}/10^X \quad (5)$$

where $$X = \Delta V_{drift.RESET}/R_{drift.RESET} = [V_{TH\_RESET}(t_{fin}) - V_{TH\_RESET}(t_{init})]/R_{drift.RESET} \quad (6)$$

Figure 4:
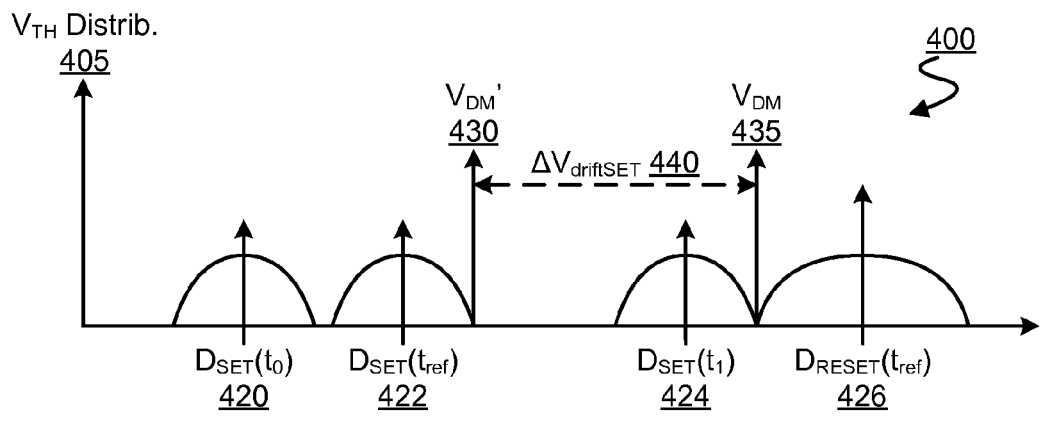
FIG. 4 is a graph showing techniques for determining, according to an embodiment, a demarcation voltage use in accessing a PCM cell.

FIG. 4 is a graph 400 illustrating the use of voltage threshold distribution 405 along a cell voltage range 410 to identify, according to an embodiment, an extended time window and/or a second demarcation voltage $V_{DM}'$ 430 for the extended time window. Features of graph 400 may include corresponding features of graph 350, for example. Graph 400 includes a set threshold voltage distribution $D_{SET}(t_1)$ 424, a demarcation voltage $V_{DM}$ 435 and a reset threshold voltage distribution $D_{RESET}(t_{ref})$ 426. In an embodiment, determination of $D_{SET}(t_1)$ 424, $V_{DM}$ 435 and $D_{RESET}(t_{ref})$ 426 may be according to techniques described herein for determining $D_{SET}(t_{fin})$ 362, $V_{DM}$ 370 and $D_{RESET}(t_{init})$ 364.

Various embodiments extend the time window $(t_{fin}-t_{init})$ for reading data in a PCM cell to a longer time window $(t_{fin}-t_0)$, where $t_0$ represents a new initial time earlier than the $t_{init}$ time unite which define when a PCM cell is first readable after a RESET (or other) state has been asserted. In an embodiment, $t_0$ is another performance requirement for a PCM device which includes the PCM cell, e.g. requiring that reads be available at least as early as $t_0$ time units after a particular state (e.g. SET or RESET) is asserted in the PCM cell.

To avoid confusion in the discussion of the expanded time window, the performance requirement time $t_{fin}$ is to be represented as time $t_1$, and the previous initial time $t_{init}$ is to be represented as time $t_{ref}$. In an embodiment, the expanded time window to $(t_1-t_0)$ is implemented by using a lower demarcation value $V_{DM}'$ 430 during a time window extension—e.g. the period of time from $t_0$ to $t_{ref}$—to distinguish between a PCM cell being in a SET state and being in a RESET state. More particularly, $V_{DM}'$ 430 may be applied to those PCM cells for which some state (e.g. SET and/or RESET) has been asserted within the last $t_{ref}$ time units of a current time, and where the PCM cell has been in the asserted state for more than $t_0$ time units.

The value of $V_{DM}'$ 430 may be determined, for example, by accounting for a set voltage drift $\Delta V_{drift.SET}$ 440 which takes place during the time window $(t_1-t_{ref})$. In an embodiment, $\Delta V_{drift.SET}$ 440 may be determined by a difference between $D_{SET}(t_1)$ 424 and $D_{SET}(t_{ref})$ 426—e.g. a difference between their respective means $V_{TH\_SET}(t_1)$ and $V_{TH\_SET}(t_{ref})$. By way of illustration and not limitation, $\Delta V_{drift.SET}$ 440 may be applied to $V_{DM}$ 435 to determine $V_{DM}'$ 430—e.g. as follows:

$$V_{DM}' \geq V_{DM} - [\Delta V_{drift.SET} \text{ for } (t_1-t_{ref})] = V_{DM} - R_{drift.SET} [\log(t_1/t_{ref})] \quad (7.1)$$

$$V_{DM}' = V_{DM} - R_{drift.SET}[\log(t_1/t_{ref})] + (\epsilon_4) \quad (7.2)$$

where $\epsilon_5$ is some nominal value to clearly distinguish that a PCM cell is in a SET state. In an embodiment, $\epsilon_4$ is a voltage margin required to account for measured voltage variations which are contributed, for example, by controlling circuitry and/or memory array parasitics.

Alternatively, $V_{DM}'$ 430 may be determined based on $D_{SET}(t_{ref})$ 422 after $D_{SET}(t_{ref})$ 422 has been determined by applying $\Delta V_{drift.SET}$ 440 to $D_{SET}(t_1)$ 424. Such determinations may be according to the following:

$$V_{TH\_SET}(t_{ref}) = V_{TH\_SET}(t_1) - R_{Drift.SET}[\log(t_1/t_{ref})] \quad (8.1)$$

$$V_{DM}' \geq V_{TH\_SET}(t_{ref}) + (D_{SET}\text{spread}) \quad (8.2)$$

$$V_{DM}' = V_{TH\_SET}(t_{ref}) + (D_{SET}\text{spread}) + (\epsilon_4) \quad (8.3)$$

where $D_{SET}(t_{ref})$ 422—a distribution which has drifted from some previous distribution $D_{SET}(t_0)$ 420 at $t_0$—is centered at a mean $V_{TH\_SET}(t_{ref})$ at time $t_{ref}$.

Figure 5:
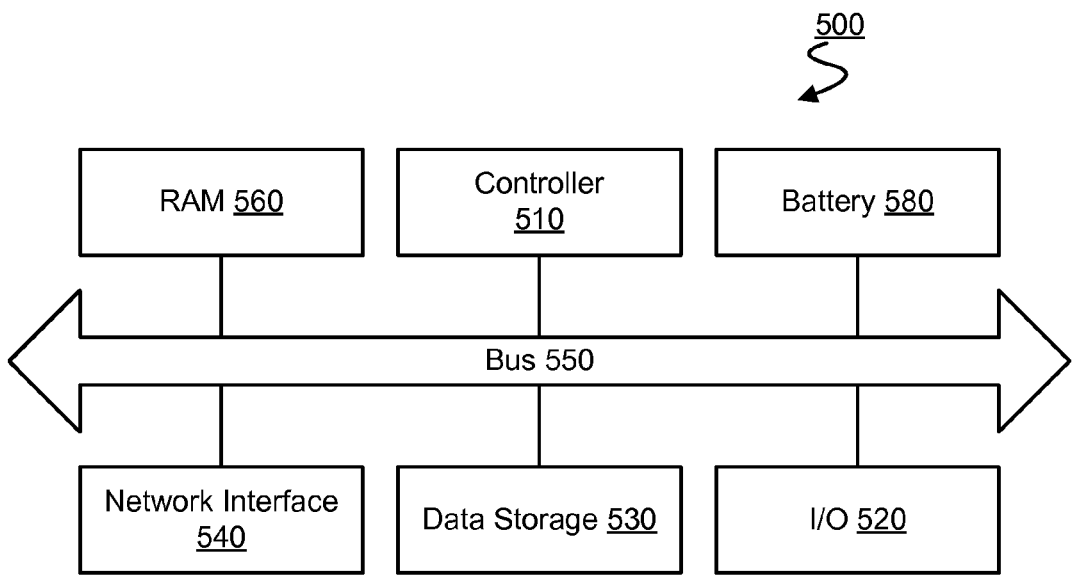
FIG. 5 is a block diagram showing elements of a computer system for determining, according to an embodiment, access information for use in accessing a PCM cell.

In FIG. 5, a computing system 500 for determining PCM access information according to an embodiment is shown. It is understood that computing system 500 is merely illustrative, and may include any of a variety of additional or alternative components and/or architectures to implement the techniques described herein. System 500 may include any of a variety of a wired or wireless computing systems including, but not limited to, a desktop computer, mainframe, server, a personal digital assistant (PDA), a laptop or portable computer, a web tablet, a wireless telephone, a pager, an instant messaging device, a digital music player, a digital camera, or other such device. System 500 may be used in and/or couple to one or more of a local area network (LAN), a wireless LAN (WLAN), a virtual LAN (VLAN), an internet, a personal area network (WPAN), a cellular network, etc. although the scope of the present invention is not limited in this respect.

System 500 may include a controller 510, an input/output (I/O) device 520 (e.g. a keypad, display), the data storage 530, a network interface 540, and a random access memory (RAM) 560 and coupled to each other via a bus 550. A battery 580 or other power supply may provide power to the system 500 in one embodiment. It should be noted that the scope of the present invention is not limited to embodiments having any or all of these components.

Controller 510 may comprise, for example, one or more microprocessors, digital signal processors, micro-controllers, or the like. The data storage 530 may be used to store messages transmitted to or by system 500. The RAM 560 also optionally be used to store instructions that are executed by controller 510 during the operation of system 500, and may be used to store user data.

The I/O device 520 may be used to generate a message. The system 500 may use the network interface 540 to transmit and/or receive messages to and/or from a wired or wireless communication network—e.g. with a radio frequency (RF) signal. Examples of the network interface 540 may include an antenna, or a wireless transceiver, such as a dipole antenna, although the scope of the present invention is not limited in this respect.

Figure 6:
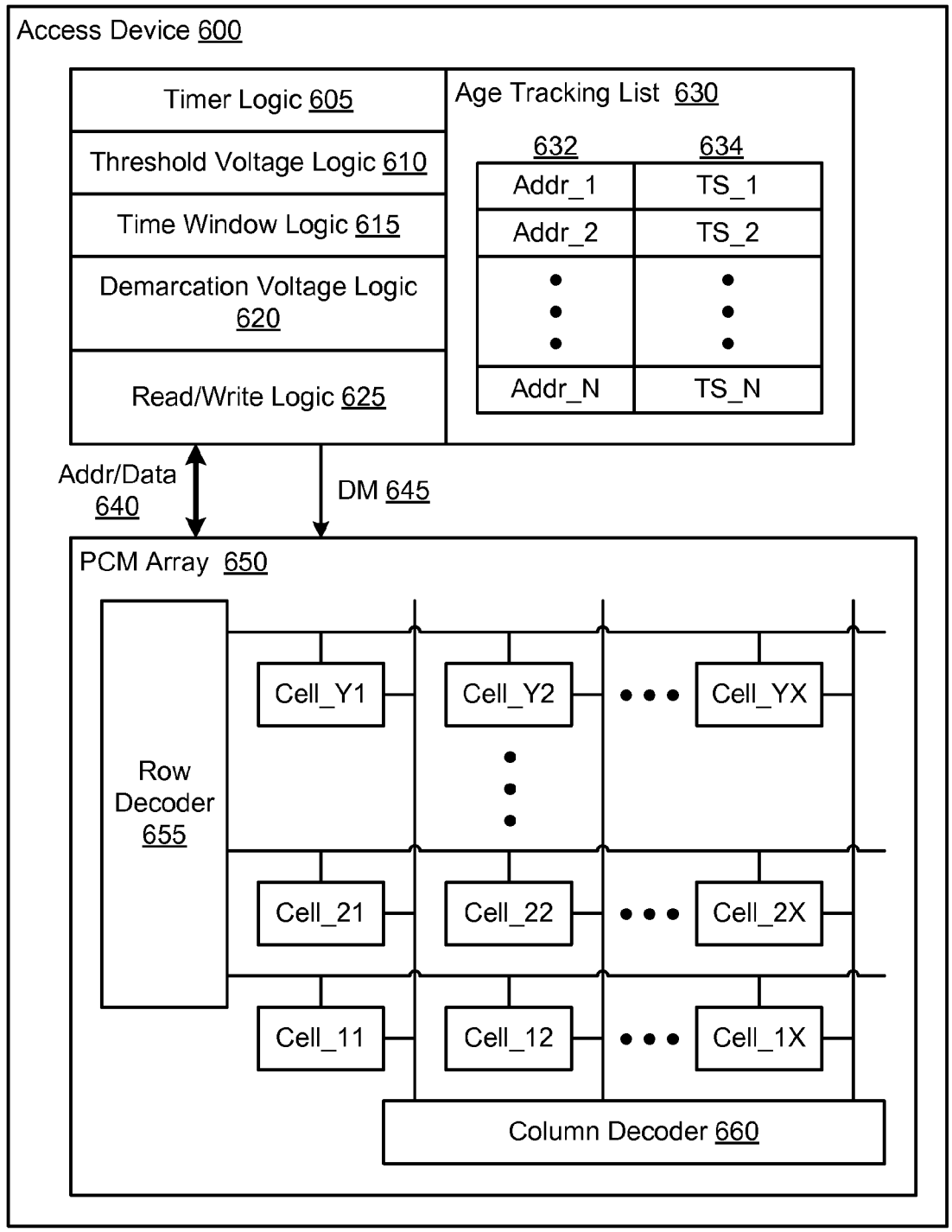
FIG. 6 is a block diagram showing elements of an access device for determining, according to an embodiment, access information for use in accessing a PCM cell.

FIG. 6 illustrates select elements of an access device 600 according to an embodiment to determine access information for one or more PCM cells. In an embodiment, access device 600 may include a computer such as computing system 100 or a component (e.g. a processor, memory controller, controller hub, storage, RAM, network interface, etc.) such as one or those within computing system 100 which includes hardware logic (e.g. circuitry, state machine, data storage, etc.) and/or software logic (e.g. a program executing with a processor and a memory) to implement the techniques described herein.

The access information determined by access device 600 may, in an embodiment, determine whether, when and/or how one or more PCM cells are to be accessed—e.g. read, refreshed, asserted to a SET state, asserted to a RESET state, etc. For example, the access information may describe or otherwise indicate a time window during which data may be read from a PCM cell. For example, the access information may identify or otherwise indicate one or more characteristics of a set threshold voltage (or distribution thereof) and/or a reset threshold voltage (or distribution thereof) for use in determining the time window. Alternatively or in addition, the access information may identify or otherwise indicate one or more demarcation voltages to be used in accessing—e.g. determining a current set (e.g. SET state or RESET state) of—the PCM cell. It is understood that various additional or alternative type of access information may be determined by access device 600, according to various embodiments.

Access device 600 may be coupled to external logic (not shown) to receive one or more performance requirements, operating conditions or other input data for use in determining the access information. Some or all of such input data may be provided during manufacturing of access device 600. Alternatively or in addition, some or all of such input data may be provided during operation of access device 600—e.g. to dynamically reconfigure said operation for improved accessing of PCM cells. By way of illustration and not limitation, access device 600 may receive input data describing one or more of $t_{fin}$, $t_0$, $V_{CC}$, $V_{TH\_SET}(t_{fin})$, etc. Alternatively or in addition, access device 600 may include logic for evaluating the performance of PCM structures to locally calculate one or more of such input data.

Access device 600 may include one or more PCM structures (registers, queues, caches, buffers, etc.) such as a PCM array 650 of memory cells for storing data to be accessed—e.g. according to the access information determined by access device 600. By way of illustration and not limitation, PCM array 650 may include a row decoder 655 and a column decoder 660 to selectively access cells in a Y-by-X PCM cell array. Alternately or in addition, access device 600 may determine access information for accessing one or more PCM cells which are remote from access device 600—e.g. where access device 600 does not itself include PCM structures such as PCM array 650.

Access device 600 may include one or more of hardware logic (e.g. FPGA, ASIC, state machine, etc.) and/or software logic (e.g. a processor executing a program in a memory) to generate the access information described herein. Such logic may be alternately referred to as circuit logic and/or circuitry, at least insofar as a processor or other circuitry underlies such logic.

By way of illustration and not limitation, access device 600 may include threshold voltage logic 610 to identify one or more characteristics of a threshold voltage and/or a threshold voltage distribution for multiple PCM cells. Such characteristics may include, but are not limited to, $V_{TH\_SET}$, $V_{TH\_RESET}$, $D_{SET}$ spread, $D_{RESET}$ spread, etc. In an embodiment, some or all of such characteristics may each be specific to a particular respective time—e.g. specific to one or more of $t_{fin}$, $t_{init}$, $t_0$, etc.

Additionally or alternatively, access device 600 may include time window logic 615 to determine one or more time windows—e.g. ($t_{fin}-t_{init}$) and/or ($t_{fin}-t_0$)—defining the earliest and latest times that a PCM cell may be read from. In an embodiment, time window logic 615 may determine time window information according to techniques described herein—e.g. based on the input data provided to access device 600 and/or threshold voltage information provided by threshold voltage logic 610.

Additionally or alternatively, access device 600 may include demarcation voltage logic 620 to determine one or more demarcation voltages—e.g. $V_{DM}$ and/or $V_{DM}'$—to be used in reading data in a PCM cell. In an embodiment, demarcation voltage logic 620 may determine demarcation voltage information according to techniques described herein—e.g. based on the input data provided to access device 600 and/or threshold voltage information provided by threshold voltage logic 610.

Additionally or alternatively, access device 600 includes read/write logic 625 to access a PCM structure—e.g. PCM array 650—according to the determined access information. In an embodiment, read/write logic 625 exchanges address and/or data signals 640 with PCM array 650 for the reading, writing, refreshing, etc. of one or more bits of PCM array 650. In an embodiment, the timing of address and/or data signals 640 may be based on time window information provided by time window logic 615. Alternatively or in addition, read/write logic 625 may provide a demarcation voltage signal DM 645 to determine demarcation voltage to apply in evaluating a state of one or more bits of PCM array 650—e.g. where a voltage level indicted by demarcation voltage signal DM 645 is based on threshold voltage distribution information determined by and/or provided to access device 600.

Additionally or alternatively, access device 600 may include timer logic 605 to control when read/write logic 625 is permitted to access certain PCM cells. In an embodiment, access device 600 further includes an age tracking list 630 for operation with timer logic 605. As various locations in PCM array 650 are accessed, timer logic 605 may write their respective address information 632 to age tracking list 630, as well as corresponding time stamp information 634 indicating a time of the accessing of the corresponding location in PCM array 650.

Alternatively or in addition, timer logic 605 may access a clock or other time-based information to age entries out of age tracking list 630 when their time stamp information indicates that they have resided in the age tracking list 630 for some maximum period of time. By way of illustration and not limitation, entries may be aged out of age tracking list 630 after $t_{ref}$ units of time have passed since they were last accessed.

In an embodiment, aging a PCM location out of age tracking list 630 corresponds to transitioning from using one demarcation voltage (e.g. $V_{DM}'$ 430) to access that PCM location to using another demarcation voltage (e.g. $V_{DM}$ 435) to access that PCM location. In an alternate embodiment, aging a PCM location out of age tracking list 630 corresponds to the beginning of a time window for the PCM location, where the PCM location is newly available to be read.

In an embodiment, timer logic 605 may additionally or alternatively control read/write logic 625 to implement a refresh scheme. By way of illustration and not limitation, timer logic 605 may direct read/write logic 625 perform a refresh cycle within every $t_{fin}$ time units of the previous refresh cycle. Such timing of refresh cycles will reduce the risk that the reset threshold voltage of PCM cell drifts up to the supply voltage level $V_{CC}$, whereupon the PCM cell will no longer be writable.

In an embodiment, a refresh cycle implemented with timer logic 605 and read/write logic 625 includes reading all data in PCM array 650. The act of reading will cause the memory material of PCM cells in a SET state to be reinitialized to a lower value for their set threshold voltage $V_{TH\_SET}$.

The reading of all data in PCM array 650 will allow identification—e.g. by read/write logic 625—of those PCM cells which are currently at a RESET state. Read/write logic 625 may thereafter reassert the RESET states of the identified PCM cells, to reinitialized to a lower value their respective reset threshold voltages $V_{TH\_RESET}$. In an embodiment, the refresh scheme only reasserts to PCM cells which are in a RESET state—i.e. without also reasserting PCM cells which are in a SET state. Such selective reasserting of only RESET PCM cells reduces the power consumption of the refresh cycle.

Figure 7:
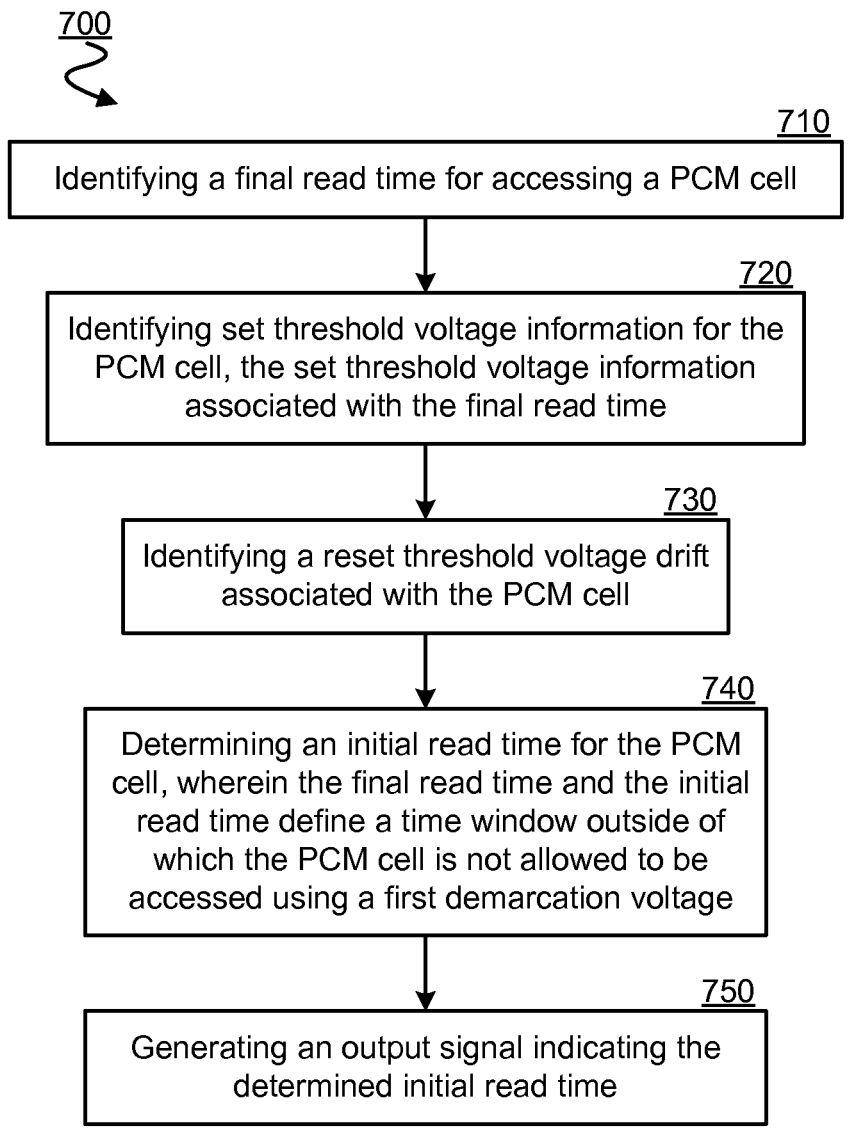
FIG. 7 is a flow diagram illustrating a method, according to an embodiment, for determining access information.

FIG. 7 illustrates select elements of a method 700 according to an embodiment to determine access information for a PCM device. Method 700 may be performed by access device 600, for example.

In an embodiment, method 700 includes, at 710, identifying a final read time—e.g. $t_{fin}$—for accessing a PCM cell. As discussed herein, a final read time may be provided as a performance requirement for a PCM device and/or may represent the time at which reset threshold voltage for one or more PCM cells is to be at or just below some upper voltage limit—e.g. a supply voltage level $V_{CC}$ which powers cells of the PCM device.

Method 700 may further include, at 710, identifying set threshold voltage information for the PCM cell, the set threshold voltage information associated with the final read time. By way of illustration and not limitation, one or more of $D_{SET}(t_{fin})$, $V_{TH\_SET}(t_{fin})$ and/or the spread for DSET may be identified—e.g. based on design testing of a PCM device's performance.

Method 700 may further include, at 720, identifying a reset threshold voltage drift associated with the PCM cell. In an embodiment, the reset threshold voltage drift varies with a logarithm of time which has expired after an asserting of a reset state.

Based on the identified final read time, set threshold voltage information and reset threshold voltage drift, method 700 may, at 730, determine an initial read time for the PCM cell, wherein the final read time and the initial read time define a time window outside of which the PCM cell is not allowed to be accessed using a first demarcation voltage. Furthermore, based on the determining at 740, method 700 may generate, at 750, an output signal indicating the determined initial read time. By way of illustration and not limitation, a signal may be sent to store an identifier of $t_{init}$ and/or the time window $(t_{fin}-t_{init})$.

Techniques and architectures for operating a data storage device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A method comprising:
    identifying a final read time for accessing a phase change memory (PCM) cell;
    identifying set threshold voltage information for the PCM cell, the set threshold voltage information associated with the final read time;
    identifying a reset threshold voltage drift associated with the PCM cell;
    based on the identified final read time, set threshold voltage information and reset threshold voltage drift, determining an initial read time for the PCM cell, wherein the final read time and the initial read time define a time window outside of which the PCM cell is not allowed to be accessed using a first demarcation voltage; and
    generating an output signal indicating the determined initial read time.

2. The method of claim 1, wherein the initial reset threshold voltage information is associated with the initial read time, and wherein determining the initial read time for the PCM cell includes:
    associating final reset threshold voltage information for the PCM cell with the final read time;
    determining initial reset threshold voltage information for the PCM cell based on the set threshold voltage information;
    determining a time difference based on the reset threshold voltage drift and a difference between the final reset threshold voltage information and the initial reset threshold voltage information; and
    applying the determined time difference to the final read time to determine the initial read time.

3. The method of claim 1, further comprising determining the first demarcation voltage based on the set threshold voltage information for the PCM cell.

4. The method of claim 1, further comprising
    identifying a third read time which is before the initial read time;
    identifying a set threshold voltage drift associated with the PCM cell;
    based on the third read time, the set threshold voltage drift and the set threshold voltage information, determining a time window extension prior to the first time window, wherein a second demarcation voltage is to be used for any accessing the PCM cell during the time window extension.

5. The method of claim 4, further comprising:
    for each of one or more PCM cells, storing a respective entry in an age tracking list, the entry including information indicating the PCM cell and a time stamp for a most recent accessing of the PCM cell;

detecting from the time stamp of one of the entries that an age of the most recent accessing of the respective PCM cell for the entry is greater than a size of the time window extension; and in response to the detecting, removing the one of the entries from the age tracking list.

6. The method of claim 5, further comprising determining from the age tracking list PCM cells to exclude from a data refresh cycle.

7. The method of claim 6, wherein the refresh cycle includes:
reading a set of PCM cells;
identifying from the reading the set of PCM cells a subset of PCM cells, wherein each of the subset of PCM cells is in a reset state; and
writing only to each of the subset of PCM cells to reassert only the respective reset states of the subset of PCM cells.

8. A computer-readable storage medium having stored thereon instructions which, when executed by one or more processors, cause the one or more processors to perform a method comprising:
identifying a final read time for accessing a phase change memory (PCM) cell;
identifying set threshold voltage information for the PCM cell, the set threshold voltage information associated with the final read time;
identifying a reset threshold voltage drift associated with the PCM cell;
based on the identified final read time, set threshold voltage information and reset threshold voltage drift, determining an initial read time for the PCM cell, wherein the final read time and the initial read time define a time window outside of which the PCM cell is not allowed to be accessed using a first demarcation voltage; and
generating an output signal indicating the determined initial read time.

9. The computer-readable storage media of claim 8, wherein the initial reset threshold voltage information is associated with the initial read time, and wherein determining the initial read time for the PCM cell includes:
associating final reset threshold voltage information for the PCM cell with the final read time;
determining initial reset threshold voltage information for the PCM cell based on the set threshold voltage information;
determining a time difference based on the reset threshold voltage drift and a difference between the final reset threshold voltage information and the initial reset threshold voltage information; and
applying the determined time difference to the final read time to determine the initial read time.

10. The computer-readable storage media of claim 8, further comprising determining the first demarcation voltage based on the set threshold voltage information for the PCM cell.

11. The computer-readable storage media of claim 8, further comprising
identifying a third read time which is before the initial read time;
identifying a set threshold voltage drift associated with the PCM cell;
based on the third read time, the set threshold voltage drift and the set threshold voltage information, determining a time window extension prior to the first time window, wherein a second demarcation voltage is to be used for any accessing the PCM cell during the time window extension.

12. The computer-readable storage media of claim 11, further comprising:
for each of one or more PCM cells, storing a respective entry in an age tracking list, the entry including information indicating the PCM cell and a time stamp for a most recent accessing of the PCM cell;
detecting from the time stamp of one of the entries that an age of the most recent accessing of the respective PCM cell for the entry is greater than a size of the time window extension; and
in response to the detecting, removing the one of the entries from the age tracking list.

13. The computer-readable storage media of claim 12, further comprising
determining from the age tracking list PCM cells to exclude from a data refresh cycle.

14. The computer-readable storage media of claim 13, wherein the refresh cycle includes:
reading a set of PCM cells;
identifying from the reading the set of PCM cells a subset of PCM cells, wherein each of the subset of PCM cells is in a reset state; and
writing only to each of the subset of PCM cells to reassert only the respective reset states of the subset of PCM cells.

15. A device comprising:
circuitry to identify a final read time for accessing a phase change memory (PCM) cell;
circuitry to identify set threshold voltage information for the PCM cell, the set threshold voltage information associated with the final read time;
circuitry to identify a reset threshold voltage drift associated with the PCM cell;
circuitry to determine, based on the identified final read time, set threshold voltage information and reset threshold voltage drift, an initial read time for the PCM cell, wherein the final read time and the initial read time define a time window outside of which the PCM cell is not allowed to be accessed using a first demarcation voltage; and
circuitry to generate an output signal indicating the determined initial read time.

16. The device of claim 15, wherein the initial reset threshold voltage information is associated with the initial read time, and wherein the circuitry to determine the initial read time for the PCM cell includes:
circuitry to associate final reset threshold voltage information for the PCM cell with the final read time;
circuitry to determine initial reset threshold voltage information for the PCM cell based on the set threshold voltage information;
circuitry to determine a time difference based on the reset threshold voltage drift and a difference between the final reset threshold voltage information and the initial reset threshold voltage information; and
circuitry to apply the determined time difference to the final read time to determine the initial read time.

17. The device of claim 15, further comprising circuitry to determine the first demarcation voltage based on the set threshold voltage information for the PCM cell.

18. The device of claim 15, further comprising:
circuitry to identify a third read time which is before the initial read time;

circuitry to identify a set threshold voltage drift associated with the PCM cell;

circuitry to determine, based on the third read time, the set threshold voltage drift and the set threshold voltage information, a time window extension prior to the first time window, wherein a second demarcation voltage is to be used for any accessing the PCM cell during the time window extension.

19. The device of claim 18, further comprising:

for each of one or more PCM cells, circuitry to store a respective entry in an age tracking list, the entry including information indicating the PCM cell and a time stamp for a most recent accessing of the PCM cell;

circuitry to detect from the time stamp of one of the entries that an age of the most recent accessing of the respective PCM cell for the entry is greater than a size of the time window extension; and circuitry to remove the one of the entries from the age tracking list in response to the detecting.

20. The device of claim 19, further comprising circuitry to determine from the age tracking list PCM cells to exclude from a data refresh cycle.

* * * * *